(12) United States Patent
Parkhe

(10) Patent No.: US 12,400,896 B2
(45) Date of Patent: Aug. 26, 2025

(54) FABRICATION OF SUBSTRATE SUPPORT DEVICES USING INORGANIC DIELECTRIC BONDING

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 231 days.

(21) Appl. No.: 18/201,332

(22) Filed: May 24, 2023

(65) Prior Publication Data

US 2024/0395591 A1    Nov. 28, 2024

(51) Int. Cl.
| | |
|---|---|
| H01T 23/00 | (2006.01) |
| H01L 21/67 | (2006.01) |
| H01L 21/683 | (2006.01) |
| H01L 21/687 | (2006.01) |

(52) U.S. Cl.
CPC .... H01L 21/6833 (2013.01); H01L 21/67103 (2013.01); H01L 21/68785 (2013.01)

(58) Field of Classification Search
None
See application file for complete search history.

(56) References Cited

U.S. PATENT DOCUMENTS

| | | | |
|---|---|---|---|
| 10,440,777 B2 | 10/2019 | Zhang | |
| 11,482,444 B2 | 10/2022 | Parkhe | |
| 2013/0277357 A1 | 10/2013 | Tatsumi et al. | |
| 2015/0283555 A1* | 10/2015 | Khe | B82Y 30/00 |
| | | | 204/547 |
| 2018/0122680 A1 | 5/2018 | Yang | |
| 2019/0088519 A1* | 3/2019 | Cho | H01L 21/67103 |
| 2019/0371577 A1* | 12/2019 | Benjaminson | H01L 21/67103 |
| 2020/0395236 A1 | 12/2020 | Iijima et al. | |
| 2021/0287923 A1* | 9/2021 | Parkhe | H01L 21/6833 |
| 2022/0254670 A1 | 8/2022 | Parkhe | |
| 2022/0270906 A1 | 8/2022 | Parkhe | |

OTHER PUBLICATIONS

International Search Report and Written Opinion for International Application No. PCT/US2024/030419, mailed Sep. 6, 2024, 09 pages.

* cited by examiner

Primary Examiner — Stephen W Jackson
(74) Attorney, Agent, or Firm — Lowenstein Sandler LLP

(57) ABSTRACT

A device includes a first plate including a first dielectric material and having a first set of electrodes embedded therein, a second plate including a second dielectric material and having a second set of electrodes embedded therein, and an inorganic dielectric bond including an inorganic dielectric material disposed between the first plate and the second plate. The first plate and the second plate are disposed on a base structure.

20 Claims, 7 Drawing Sheets

FABRICATION OF SUBSTRATE SUPPORT DEVICES USING INORGANIC DIELECTRIC BONDING

TECHNICAL FIELD

Embodiments of the present invention relate, in general, to substrate processing, and in particular, to fabrication of substrate support devices, such as electrostatic chucks (ESCs) and/or heater devices, using inorganic dielectric bonding.

BACKGROUND

An electronic device manufacturing apparatus can include multiple chambers, such as processing chambers and load lock chambers. Such an electronic device manufacturing apparatus can employ a robot apparatus in the transfer chamber that is configured to transport substrates between the multiple chambers. In some instances, multiple substrates are transferred together. Processing chambers may be used in an electronic device manufacturing apparatus to perform one or more processes on substrates, such as deposition processes, etch processes and/or lithography processes. An electrostatic chuck (ESC) is a device that can generate electrostatic force to securely hold a substrate (e.g., wafer) in place against a puck without requiring physical force during one or more processes, such as during deposition, etching and/or lithography processes. Utilizing electrostatic force, without requiring physical force, can reduce the risk of damage to the substrate during processing and can create a more stable and/or uniform hold as compared to other chucks (e.g., mechanical chucks).

SUMMARY

In some embodiments, a substrate support assembly is provided. The substrate support assembly includes a substrate supports. The substrate support includes a first plate including a first dielectric material and having a first set of electrodes embedded therein, a second plate including the first dielectric material or a second dielectric material and having a second set of electrodes embedded therein, and an inorganic dielectric bond including an inorganic dielectric material disposed between the first plate and the second plate. The substrate support assembly further includes a cooling plate coupled to the substrate support, the cooling plate including a set of cooling channels.

In some embodiments, a processing chamber is provided. The processing chamber includes a substrate support assembly including a substrate support coupled to a cooling plate including a set of cooling channels. The substrate support includes a first plate including a first dielectric material and having a first set of electrodes embedded therein, a second plate including the first dielectric material or a second dielectric material and having a second set of electrodes embedded therein, and an inorganic dielectric bond including an inorganic dielectric material disposed between the first plate and the second plate.

In some embodiments, a method is provided. The method includes forming a substrate support of a substrate support assembly. Forming the substrate support includes bonding a first plate to a second plate using an inorganic dielectric bond including an inorganic dielectric material disposed between the first plate and the second plate. The first plate comprises a first dielectric material having a first set of electrodes embedded therein, and the second plate includes the first dielectric material or a second dielectric material and having a second set of electrodes embedded therein. The method further includes attaching the substrate support to a base structure comprising a cooling plate having a set of cooling channels.

Numerous other aspects and features are provided in accordance with these and other embodiments of the disclosure. Other features and aspects of embodiments of the disclosure will become more fully apparent from the following detailed description, the claims, and the accompanying drawings.

BRIEF DESCRIPTION OF THE DRAWINGS

Embodiments described herein are illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
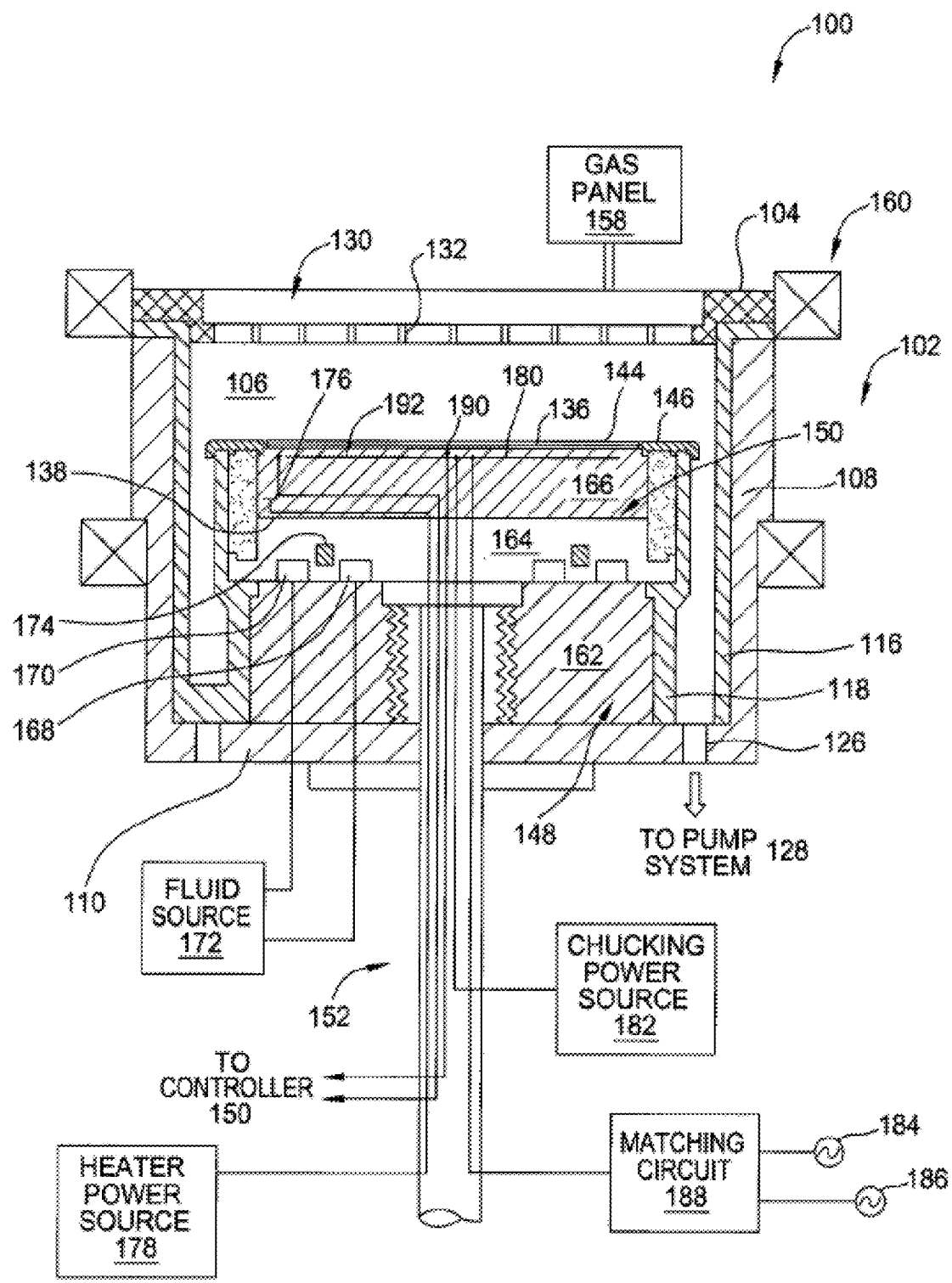
FIG. 1 is a diagram of a cross-sectional view of a processing chamber, in accordance with some embodiments.

Described herein are embodiments of fabrication of substrate support devices (also referred to herein as substrate supports), such as electrostatic chucks (ESCs) and/or heater devices, using inorganic dielectric bonding. An ESC can include a flat ESC plate, or puck, with a set of chucking electrodes embedded in the puck. When a voltage is applied to the set of chucking electrodes, an electrostatic field having a strength proportional to the applied voltage is created between the ESC plate and the substrate as well as the distance between the surfaces of the ESC plate and the substrate. Thus, when the applied voltage is sufficiently high, the electrostatic field can have sufficient strength to generate an electrostatic force that securely holds the substrate in place on the ESC plate. ESCs can be designed to accommodate various substrate sizes and/or shapes. For example, an ESC can have ring-shaped electrodes embedded within the ESC plate to hold circular substrates. As another example, an ESC can have a grid pattern of chucking electrodes embedded within the ESC plate to hold square or rectangular substrates.

During processing of a substrate that utilizes an ESC to securely hold the substrate, uniformity of temperature control across the surface of the substrate can be challenging due to the non-homogeneous construction of the ESC on which the substrate is held. For example, some regions of the ESC have gas holes, while other regions have lift pin holes that are laterally offset from the gas holes. Still, other regions have chucking electrodes, while other regions may have a set of heater electrodes that are laterally offset from the chucking electrodes. Since the structure of the ESC can vary both laterally and azimuthally, uniformity of heat transfer between the ESC and substrate can be complicated and very difficult to obtain, resulting in local hot and cold spots across the chuck surface, which consequently result in non-uniformity of processing results along the surface of the substrate.

To address at least the above-noted drawbacks, embodiments described herein provide for fabrication of substrate support devices, such as ESCs and/or heaters for substrate processing, using inorganic dielectric bonding. For example, a substrate support device can include an ESC plate (e.g., puck) bonded to a heater plate by a ceramic or glass bond. The ESC plate can include a set of chucking electrodes embedded therein. The heater plate can include a set of heater electrodes embedded therein to heat the substrate to a target temperature during a manufacturing process, such as deposition, etching and/or lithography. The temperature of the heater plate can be controlled by a temperature controller coupled to the set of heater electrodes by regulating the power supplied to the set of heater electrodes. The temperature controller can enable precise control of the temperature of the substrate within a range needed to optimize the manufacturing process being performed.

The ESC plate can be formed from a first dielectric material and the heater plate can be formed from the first dielectric material or a second dielectric material. In some embodiments, at least one of the first dielectric material or the second dielectric material is a ceramic material. In some embodiments, at least one of the first dielectric material or the second dielectric material includes aluminum nitride (AlN). In some embodiments, at least one of the first dielectric material or the second dielectric material includes aluminum oxide or alumina ($Al_2O_3$).

The heater plate can be bonded to the ESC plate using an inorganic dielectric bond. In contrast to a diffusion bond, which is a bond formed at an interface of two materials by pressing together the two materials under high temperature conditions to enable atoms to diffuse across the interface, an inorganic dielectric bond can be formed by employing an additional inorganic dielectric bonding material. Some processes for processing substrates can be high-temperature processes that are optimally performed at suitable high temperatures. For example, some processes can be performed at temperatures greater than or equal to 600° C. Some bonding materials cannot tolerate such high temperatures. Some bonding materials can tolerate such high temperatures, but are formed from electrically conducting material (e.g., metal bonds) and thus cannot provide electrical insulation between the ESC plate and the heater plate. Additionally, some bonding materials do not provide adequate plasma erosion resistance during manufacturing processes that involve the use of plasma.

To provide electrical insulation, high temperature tolerance and plasma erosion resistance during substrate processing, the ESC plate can be bonded to the heater plate using inorganic dielectric bonding that forms an inorganic dielectric bond. An inorganic dielectric bond can be formed from an inorganic material (i.e., a material that does not include any carbon-hydrogen bonds) that provides suitable electrical insulation between the ESC plate and the heater plate, and resistance to various stresses exhibited during substrate processing (e.g., high temperature and plasma erosion). In some embodiments, the inorganic dielectric bond enables high-temperature operation greater than or equal to 600° C. In some embodiments, the inorganic dielectric bond enables high-temperature operation greater than or equal to 700° C.

Additionally, the inorganic material of the inorganic dielectric bond can be selected to have a coefficient of thermal expansion (CTE) that is about equal to the CTE of the first dielectric material of the ESC plate and the second dielectric material of the heater plate. CTE is a measurement of how much a material expands when the material is heated and/or contracts when the material is cooled. For example, CTE can be defined as a fractional change in at least one physical parameter of the material (e.g., length or volume) per degree of temperature change. If two materials having different CTEs are bonded together, the materials may exhibit stress as a result of expansion/contraction caused by temperature change, which can lead to deformations such as cracking, delamination, etc. Accordingly, selecting the inorganic material to have a CTE that is about equal to the CTE of the first dielectric material of the ESC plate and the second dielectric material of the heater plate can prevent deformations caused by expansion/contraction stresses caused by temperature changes that can occur during substrate processing.

In some embodiments, the inorganic dielectric material includes a glass material. For example, the glass material can include at least one of silicon (Si), barium (Ba), calcium (Ca), yttrium (Y), magnesium (Mg), oxygen (O), boron (B), etc. In some embodiments, the inorganic dielectric material includes a ceramic material including at least one of Ca, Si, O, Mg, B, aluminum (Al), nickel (N), iron (F), etc. The inorganic dielectric material can be modified (e.g., doped) to achieve a target combination of properties, such as electrical insulation, high temperature tolerance and/or plasma erosion resistance properties. In some embodiments, the inorganic dielectric material used for the inorganic dielectric bond comprises one or more materials not included in the first plate and/or in the second plate.

In some embodiments, the substrate support device is a multi-zone ESC including multiple temperature zones ("zones"). The multi-zone ESC can include a set of tunable heaters that can enable high-resolution and zone-independent temperature control for tuning a temperature profile of a substrate securely held by the ESC during processing. To achieve a target temperature profile, power to respective tunable heaters can be controlled (e.g., increased, decreased or held constant) in order to independently control the temperature with respect to each zone. In some embodiments, the set of zones includes four zones (e.g., a four-zone (4Z) ESC)). In some embodiments, the set of tunable heaters includes a set of primary heaters. The set of primary heaters can overlap the set of temperature zones to enable coarse temperature control. In some embodiments, the set of tunable heaters includes a set of secondary heaters. The set of secondary heaters can enable fine temperature control over multiple sub-zones defined within the zones. In some embodiments, the multiple sub-zones include at least fifty sub-zones. In some embodiments, the multiple sub-zones include at least 150 sub-zones.

For example, fabricating a substrate support device can include obtaining or manufacturing a first plate. A first set of electrodes can be embedded within the first plate. In some embodiments, obtaining or manufacturing the first plate can include embedding the first set of electrodes within the first plate (e.g., forming the first plate around the first set of electrodes, such as via a sintering process). In some embodiments, the first plate is an ESC plate and the first set of electrodes includes a set of chucking electrodes. In some embodiments, the first plate is a heater plate and the first set of electrodes includes a set of heater electrodes. Fabricating the substrate support device can further include bonding the first plate to a second plate. A second set of electrodes can be embedded within the second plate. In some embodiments, fabricating the substrate support device further includes embedding the second set of electrodes within the second plate (e.g., forming the second plate around the second set of electrodes, such as via a sintering process) prior to bonding the first plate to the second plate.

In some embodiments, the second plate is a heater plate and the second set of electrodes includes a set of heater electrodes (e.g., if the first plate is an ESC plate). In some embodiments, the second plate is an ESC plate and the second set of electrodes includes a set of chucking electrodes (e.g., if the first plate is a heater plate). In some embodiments, fabricating the substrate support device can further include forming one or more additional plates and/or coupling the one or more additional plates to the second plate. For example, the second plate may be bonded to a third plate (which may be manufactured to include a third set of electrodes). In some embodiments, third plate includes a dielectric material. For example, the third plate can include a ceramic material. The ceramic material of the third plate may be the same as or different from the ceramic material of the first and/or second plates. In some embodiments, the third plate is bonded to the second plate via an inorganic dielectric bond.

The first plate, the second plate and/or the third plate may form a substrate support, which may be attached to a cooling plate, base plate and/or facilities plate to complete a substrate support assembly. In some embodiments, the substrate support is coupled to a cooling plate that includes multiple cooling channels embedded therein. Cooling channels are pathways that allow a cooling fluid (e.g., water) to flow through the substrate support to dissipate heat during substrate processing without interfering with the ability of the substrate support to hold the wafer securely in place. In some embodiments, the substrate support is to maintain a temperature of the substrate support and/or the substrate within a safe range to prevent damage to the substrate support, the substrate and/or the rest of a processing chamber. The design and configuration of cooling channels can depend on different variables, such as the structure of the substrate support and/or the manufacturing processes being used to process the substrate. Further details regarding fabricating substrate support devices using inorganic dielectric bonding are described herein below with reference to FIGS. 1-6.

FIG. 1 is a cross-sectional view processing chamber 100, in accordance with some embodiments. Processing chamber 100 includes substrate support assembly 148 disposed therein. Processing chamber 100 includes chamber body 102 and lid 104 that enclose an interior volume 106. Chamber body 102 may be fabricated from aluminum, stainless steel or other suitable material. Chamber body 102 generally includes sidewalls 108 and bottom 110. Outer liner 116 may be disposed adjacent sidewalls 108 to protect chamber body 102. Outer liner 116 may be fabricated and/or coated with a plasma or halogen-containing gas resistant material. In one embodiment, outer liner 116 is fabricated from aluminum oxide. In another embodiment, outer liner 116 is fabricated from or coated with yttria, yttrium alloy or an oxide thereof. Exhaust port 126 may be defined in chamber body 102, and may couple interior volume 106 to pump system 128. Pump system 128 may include one or more pumps and throttle valves utilized to evacuate and regulate the pressure of interior volume 106 of processing chamber 100.

Lid 104 may be supported on sidewalls 108. Lid 104 may be opened to allow access to interior volume 106 of processing chamber 100, and may provide a seal for processing chamber 100 while closed. Gas panel 158 may be coupled to processing chamber 100 to provide process and/or cleaning gases to interior volume 106 through gas distribution assembly 130 that is part of lid 104. Examples of processing gases may be used to process in processing chamber 100 include halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). Gas distribution assembly 130 may have multiple apertures 132 on the downstream surface of gas distribution assembly 130 to direct the gas flow to the surface of substrate (e.g., wafer) 144. Additionally, gas distribution assembly 130 can have a center hole where gases are fed through a ceramic gas nozzle. Gas distribution assembly 130 may be fabricated and/or coated by a ceramic material, such as silicon carbide, yttria, etc. to provide resistance to halogen-containing chemistries to prevent gas distribution assembly 130 from corrosion.

Substrate support assembly 148 is disposed in interior volume 106 below gas distribution assembly 130. Substrate support assembly 148 holds substrate 144 during processing. Inner liner 118 may be coated on the periphery of substrate support assembly 148. Inner liner 118 may be a halogen-containing gas resist material such as those discussed with reference to outer liner 116. In one embodiment, inner liner 118 may be fabricated from the same materials of outer liner 116.

In one embodiment, substrate support assembly 148 includes mounting plate 162 supporting shaft 152 connected to a substrate support such as electrostatic chuck (ESC) 150. ESC 150 may or may not be connected to thermally conductive base 164 (e.g., a cooling plate) via bond 138. In some embodiments, substrate support 166 may include multiple plates bonded via an inorganic bond. Substrate support 166 may be a hybrid puck including a chucking region formed from a first dielectric material and a backing region and/or heating region formed from the first dielectric material and/or a second dielectric material different from the first dielectric material. For example, the first dielectric material can provide high thermal conductivity and the second dielectric material may offer leakage current stability. In some embodiments, at least one of the first dielectric material or the second dielectric material is a ceramic material. For example, the first dielectric material can include $Al_2O_3$ and the backing region can include AlN. Further details regarding substrate support 166 will be described in further detail below with reference to FIGS. 2-5.

Mounting plate 162 may be coupled to bottom 110 of chamber body 102, and may include passages for routing utilities (e.g., fluids, power lines, sensor leads, etc.) to thermally conductive base 164 and substrate support 166. In one embodiment, mounting plate 162 includes a plastic plate, a facilities plate and/or a cathode base plate.

Thermally conductive base 164 and/or substrate support 166 may include one or more optional embedded heating elements 176, embedded thermal isolators 174 and/or conduits 168, 170 to control a lateral temperature profile of substrate support assembly 148. Thermal isolators 174 (also referred to as thermal breaks) extend from an upper surface of thermally conductive base 164 towards the lower surface of thermally conductive base 164, as shown. Conduits 168, 170 may be fluidly coupled to fluid source 172 that circulates a temperature regulating fluid through conduits 168, 170.

Embedded thermal isolator 174 may be disposed between conduits 168, 170 in one embodiment. Heater 176 is regulated by heater power source 178. Conduits 168, 170 and heater 176 may be utilized to control the temperature of thermally conductive base 164, thereby heating and/or cooling puck 166 and substrate 144 being processed. Temperature of substrate support 166 and thermally conductive base 164 may be monitored using temperature sensors 190, 192, which may be monitored using controller 195.

Substrate support 166 may further include multiple gas passages such as grooves, mesas and other surface features, which may be formed in an upper surface of puck 166. The gas passages may be fluidly coupled to a source of a thermally conductive gas, such as He via holes drilled in substrate support 166. In operation, the gas may be provided at controlled pressure into the gas passages to enhance the heat transfer between substrate support 166 and substrate 144.

Substrate support 166 includes at least one clamping electrode 180 controlled by chucking power source 182. Clamping electrode 180 (or other electrode disposed in puck 166 and/or thermally conductive base 164) may further be coupled to one or more RF power sources 184, 186 through matching circuit 188 for maintaining a plasma formed from process and/or other gases within processing chamber 100. Sources 184, 186 are generally capable of producing RF signal having a frequency from about 50 kHz to about 3 GHz and a power of up to about 10,000 Watts.

Shaft 152 may be bonded to ESC 150 by a bond, braze or weld. One or more cables (e.g., for connecting to embedded heating elements 176, temperature sensors 190, 192, clamping electrode 180, etc.) may run through the interior of shaft 152, as shown. An interior of shaft 152, also referred to as an internal shaft area, has an isolated environment maintained during and/or between process runs performed by processing chamber 100. In some embodiments, the isolated environment is a vacuum environment. In some embodiments, the isolated environment includes one or more inert gases. For example, the one or more inert gases can include an inert gas mixture. The vacuum environment or inert gas(es) may prevent the interior of shaft 152 (e.g., such as an exposed braze within the interior of shaft 152) from becoming oxidized and/or may prevent the interior of shaft 152 and/or ESC 150 from becoming deformed.

Figure 2:
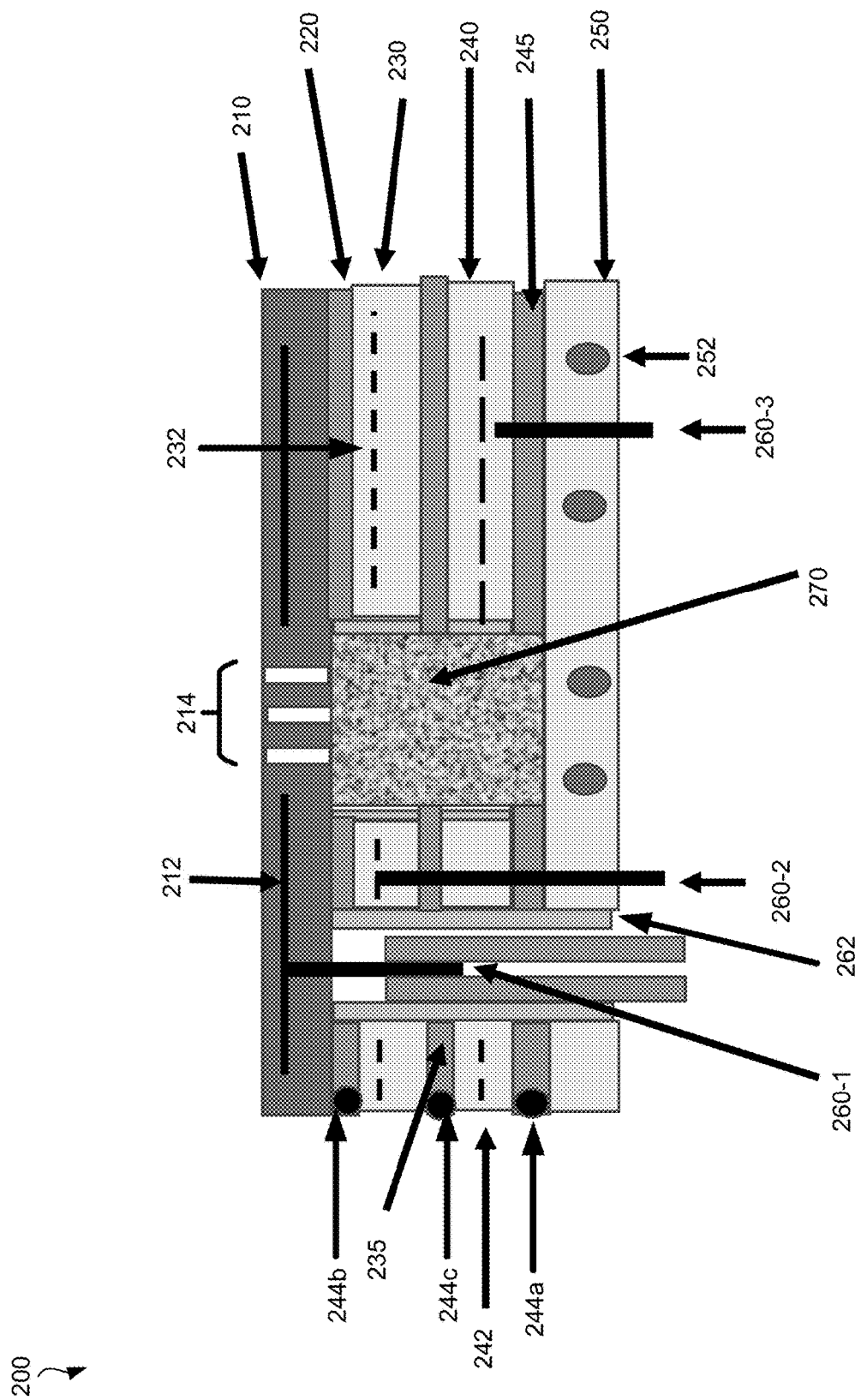
FIGS. 2-4 are diagrams of cross-sectional views of substrate support devices fabricated using inorganic dielectric bonding, in accordance with some embodiments.

FIG. 2 is a cross-sectional side view of substrate support device ("device") 200 attached to a cooling plate 250, in accordance with some embodiments. Device 200 can be a part of a substrate support assembly for use within a processing chamber to process a substrate (e.g., deposition, etching and/or lithography). In some embodiments, device 200 is an ESC. In some embodiments, device 200 is a heater. In some embodiments, device 200 is a multi-zone ESC for temperature control. In some embodiments, device 200 includes multiple temperature zones ("zones"). For example, device 200 can include at least four zones. In some embodiments, device 200 includes multiple sub-zones included within each zone. In some embodiments, the multiple sub-zones include at least fifty sub-zones. In some embodiments, the multiple sub-zones include at least 150 sub-zones.

As shown, device 200 includes first plate 210 having set of electrodes 212 embedded therein. Additionally, a set of gas distribution channels 214 can be formed within first plate 210. For example, the set of gas distribution channels 214 can be formed by drilling through first plate 210 (e.g., laser drilling). In some embodiments, first plate 210 is an ESC plate and set of electrodes 212 includes a set of chucking electrodes to enable a substrate to be securely held to first plate 210 during substrate processing. In some embodiments, set of electrodes 212 includes Auxiliary Electrodes for Chucking (AEC) electrodes to improve performance and to prevent arcing and damage during substrate processing. For example, if the voltage applied to the chucking electrodes becomes too large, the AEC electrodes can dissipate excess voltage and prevent arcing and damage to the substrate. In some embodiments, first plate 210 has a circular shape as viewed from the top of first plate 210 to secure a circular substrate. In some embodiments, first plate 210 has a rectangular shape as viewed from the top of first plate 210 to secure a rectangular substrate. First plate 210 is formed from a first dielectric material. In some embodiments, the first dielectric material is a ceramic material. For example, the first dielectric material can include AlN. As another example, the first dielectric material can include $Al_2O_3$. In some embodiments, first plate 210 has a thickness that ranges between about 0.5 millimeter (mm) to about 10 mm. In some embodiments, first plate 210 has a thickness that ranges between about 1 mm to about 5 mm.

As further shown, bonding layer 220 is disposed between first plate 210 and second plate 230. Second plate 230 is formed from the first dielectric material or a second dielectric material. In some embodiments, the second dielectric material is a ceramic material. For example, the second dielectric material can include AlN. As another example, the second dielectric material can include $Al_2O_3$. In some embodiments, second plate 230 has a thickness that ranges between about 0.5 mm to about 10 mm. In some embodiments, second plate 230 has a thickness that ranges between about 2 mm to about 6 mm.

In some embodiments, bonding layer 220 includes a first inorganic dielectric material. The first inorganic dielectric material can be selected to have a CTE that is about equal to the CTE of the first dielectric material and the second dielectric material. In some embodiments, the first inorganic dielectric material includes a glass material. For example, the glass material can include at least one of: Si, Ba, Ca, Y, Mg, O, B, etc. In some embodiments, the first inorganic dielectric material includes another ceramic material including at least one of Al, Ca, Si, O, N, Y, Mg, F, B, etc. In some embodiments, the first inorganic dielectric material comprises one or more constituents that are different from the first and/or second material of the first and/or second plates 210, 230.

Bonding layer 220 can be formed using an inorganic bonding process. For example, an inorganic bonding process can include applying an inorganic material as a powder, paste or a sheet, attaching plates 210 and 230 together, pressing plates 210 and 230 together with heating. In some embodiments, the plates 210 and 230 are pressed together under some pressure threshold.

As further shown, bonding layer 235 is disposed between second plate 230 and third plate 240. Third plate 240 is formed from the first dielectric material, the second dielectric material, or a third dielectric material. In some embodiments, the third dielectric material is a ceramic material. For example, the third dielectric material can include AlN. As another example, the third dielectric material can include $Al_2O_3$. In some embodiments, third plate 240 has a thickness that ranges between about 0.5 mm to about 10 mm. In some embodiments, third plate 240 has a thickness that ranges between about 2 mm to about 6 mm.

In some embodiments, bonding layer 235 includes a ceramic material. For example, bonding layer 235 can include the first inorganic dielectric material or a second inorganic dielectric material. The second inorganic dielectric material can be selected to have a CTE that is about equal to the CTE of the second dielectric material and the third dielectric material. In some embodiments, the second inorganic dielectric material includes a glass material. For example, the glass material can include at least one of: Si, Ba, Ca, Y, Mg, O, B, etc. In some embodiments, the inorganic dielectric material includes another ceramic material including at least one of Al, Ca, Si, O, N, Y, Mg, F, B, etc. In some embodiments, the second inorganic dielectric material comprises one or more constituents that are different from the first, second and/or third material of the second and/or third plates 230, 240.

At least one of plate 230 or plate 240 can be a heater plate to enable heating of a substrate secured to device 200. In some embodiments, second plate 230 is a heater plate including set of heater electrodes 232 embedded therein and third plate 240 is a second heater plate including second set of heater electrodes 242 embedded therein. For example, one of second plate 230 or third plate 240 can be a primary heater plate to enable primary heating across multiple zones of device 200 (e.g., coarse temperature control), and the other of second plate 230 or third plate 240 can be a secondary heater plate to enable secondary heating across multiple sub-zones device 200 (e.g., fine temperature control). In some embodiments, device 200 includes four zones.

Illustratively, third plate 240 can be a primary heater plate of device 200 and second set of heater electrodes 242 can include multiple primary heating electrodes to enable primary heating across the multiple zones, and second plate 230 can be a secondary heater plate of device 200 and first set of heater electrodes 232 can include multiple secondary heating electrodes to enable secondary heating across the multiple secondary zones. In some embodiments, the multiple sub-zones include at least fifty sub-zones. In some embodiments, the multiple sub-zones include at least 150 sub-zones.

As further shown, in one embodiment bonding layer 245 is disposed between third plate 240 and fourth plate 250 to bond third plate 240 to fourth plate 250, where fourth plate 250 is a cooling plate that may not be a part of the substrate support 200. Fourth plate 250 can be a cooling plate having multiple cooling channels including cooling channel 252 embedded therein. Cooling channels including cooling channel 252 are pathways that allow a cooling fluid (e.g., water) to flow through device 200 to dissipate heat during substrate (e.g., wafer) processing without interfering with the ability of device 200 to hold the wafer securely in place. Fourth plate 250 may keep the temperature of device 200 and the substrate supported by device 200 within a safe range to prevent damage to device 200, the substrate and/or the rest of the processing chamber. The design and configuration of the cooling channels can depend on different variables, such as the structure of device 200 and/or the manufacturing processes being used to process the substrate. In some embodiments, fourth plate 250 is formed from the first dielectric material, the second dielectric material, the third dielectric material, or a fourth dielectric material. In some embodiments, the fourth dielectric material is a ceramic material. For example, the fourth dielectric material can include AlN. As another example, the fourth dielectric material can include $Al_2O_3$. In some embodiments, fourth plate 250 is formed from aluminum or another metal having a high thermal conductivity. In some embodiments, fourth plate 250 has a thickness that ranges between about 0.5 mm to about 10 mm. In some embodiments, fourth plate 250 has a thickness that ranges between about 2 mm to about 6 mm.

In some embodiments, bonding layer 245 includes an organic material (i.e., organic bond). Examples of organic materials include silicones, epoxy resins, acrylic adhesives, cyanoacrylate adhesive, phenolic resins, etc. In some embodiments, bonding layer 245 includes a conductive material (i.e., metal material). For example, bonding layer 245 can be an aluminum bond, an AlSi alloy bond, or other suitable metal bond. In some embodiments, bonding layer 245 includes an inorganic material (i.e., inorganic bond). In some embodiments, bonding layer 245 includes a dielectric material (e.g., organic or inorganic dielectric bond). The third inorganic dielectric material can be selected to have a CTE that is about equal to the CTE of the third dielectric material and the fourth dielectric material. In some embodiments, instead of using bonding layer 245, third plate 240 is secured to fourth plate 250 via another securing mechanism. The securing mechanism can include a set of fasteners. For example, third plate 240 can be bolted to fourth plate 250.

In some embodiments, at least one sealing structure can be disposed between at least one pair of plates to provide insulation, sealing and/or isolation, such as sealing structure 244a disposed between third plate 240 and fourth plate 250. In some embodiments, a sealing structure is a washer. In some embodiments, a sealing structure is an O-ring or gasket. In this illustrative example, sealing structure 244b is shown disposed between first plate 210 and second plate 230, sealing structure 244c is shown disposed between second plate 230 and third plate 240. In some embodiments, a sealing structure is not disposed between first plate 210 and second plate 230. In some embodiments, a sealing structure is not disposed between second plate 230 and third plate 240.

Device 200 can include various contacts to enable electrical connection to respective sets of electrodes of device 200. As shown, the contacts can include contacts 260-1 through 260-3 coupled to respective sets of electrodes 212, 232, and 242. For example, contact 260-1 can be a chucking contact which can be used to apply a voltage to set of electrodes 212 that can generate an electrostatic force to secure a substrate to first plate 210. Contact 260-1 may be a high voltage contact, and may be disposed within an insulating sleeve 262 (e.g., a ceramic tube) that may isolate the high voltage contact from an external environment. As another example, contact 260-2 can be a first heater contact which can be used to apply a voltage to first set of heater electrodes 232 to control secondary heating for device 200. As yet another example, contact 260-3 can be a second heater contact which can be used to apply a voltage to second set of heater electrodes 242 to control primary heating for device 200.

Device 200 can further include plug 270 disposed in a region formed within the second and/or third plates 230, 240. Once device 200 is installed on fourth plate 250, plug 270 may be encapsulated between first plate 210 and fourth plate 250. Plug 270 can be used to reduce plasma formation and/or arcing to prevent damage to device 200 and/or the substrate. In some embodiments, plug 270 is a porous plug. Plug 270 can include any suitable material. For example, plug 270 can include a porous dielectric material. Examples of porous dielectric materials include porous ceramic materials such as porous AlN or $Al_2O_3$. The porosity of plug 270 can be selected to inhibit plasma formation and/or arcing, while allowing heat transfer fluid (e.g., helium gas) to flow through the ceramic plug and reach the substrate support surface through set of gas distribution channels 214. In some embodiments, the porosity of plug 270 ranges between about 30% to about 60%. Plug 270 can be bonded to first plate 210 and fourth plate 250 using any suitable bonding. For example, plug 270 can be bonded to at least one of first plate 210, second plate 230, third plate 240 and/or fourth plate 250 using a high-temperature adhesive (e.g., a high-temperature glue).

In some embodiments, a set of fasteners and/or threaded inserts are embedded within at least one plate (not shown). For example, sets of fasteners can be embedded within at least plate 230 and/or plate 240. In some embodiments, a set of fasteners (e.g., threaded fasteners) and/or threaded inserts are embedded in features in plate 230, and plate 240 includes holes that provide access to the threaded inserts or that enable threaded shafts of threaded fasteners to protrude from the bottom of device 200 (e.g., so that device 200 can be fastened to fourth plate 250). Each set of fasteners and/or threaded inserts can include fasteners formed from a material that has a suitably low CTE and/or a suitably high thermal conductivity. In some embodiments, each set of fasteners and/or threaded inserts is a set of molybdenum (Mo) fasteners and/or threaded inserts. One example of the use of threaded inserts and fasteners is shown in FIG. 5. Further details regarding fabricating device 200 will be described below with reference to FIG. 6. Other examples of devices that can be fabricated using inorganic dielectric bonding will now be described below with reference to FIGS. 3-5.

Figure 3:
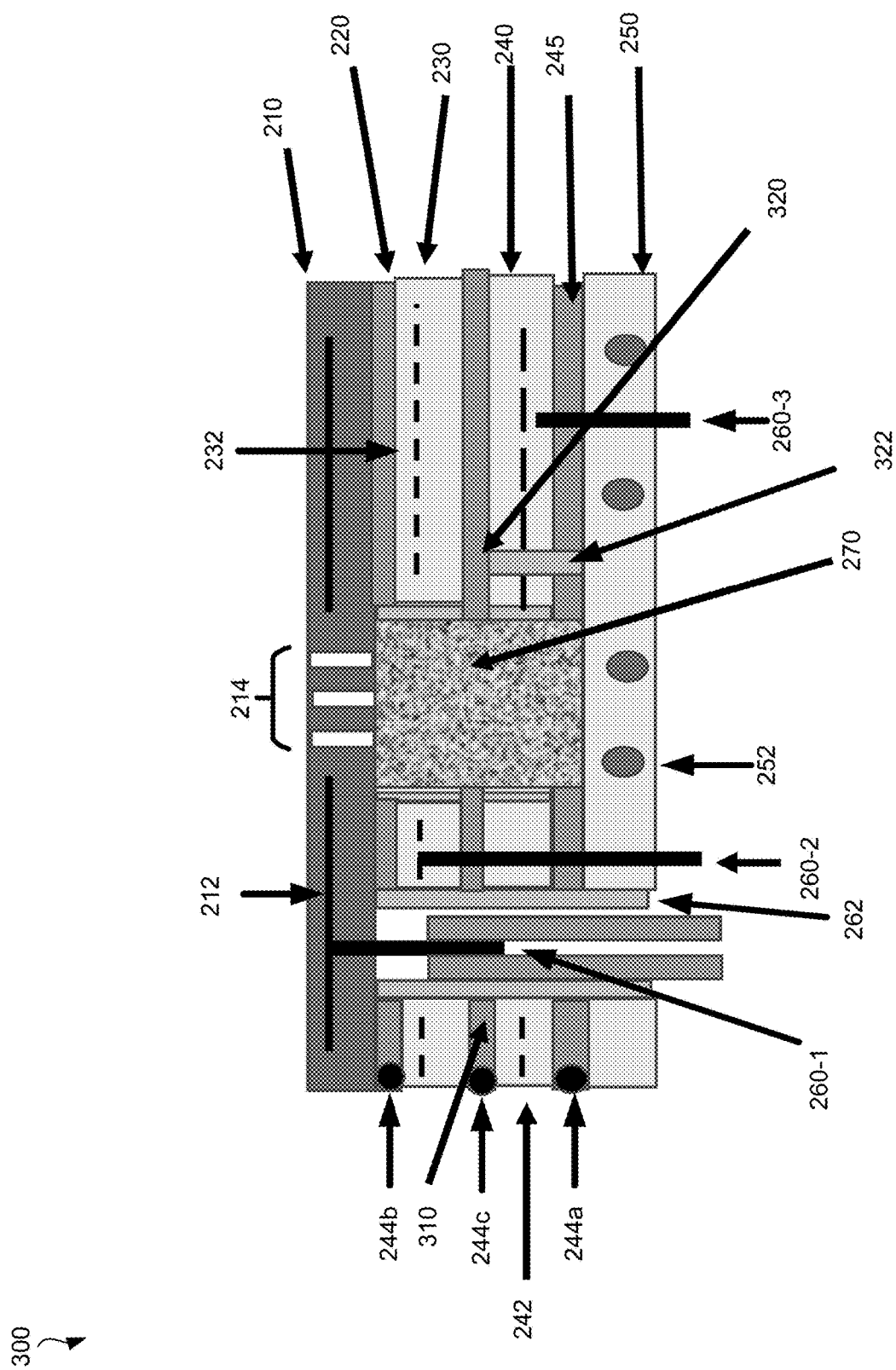

FIG. 3 is a cross-sectional view of substrate support device ("device") 300, in accordance with some embodiments. Device 300 can be a part of a substrate support assembly for use within a processing chamber to process a substrate (e.g., deposition, etching and/or lithography). In some embodiments, device 300 is an ESC. In some embodiments, device 300 is a heater. In some embodiments, device 300 is a multi-zone ESC for temperature control. In some embodiments, device 300 includes multiple temperature zones ("zones"). For example, device 300 can include at least four zones. In some embodiments, device 300 includes multiple sub-zones included within each zone. In some embodiments, the multiple sub-zones include at least fifty sub-zones. In some embodiments, the multiple sub-zones include at least 150 sub-zones.

As shown, device 300 includes components 210, 212, 214, 220, 230, 232, 240, 242, 244a-c, 245, 250, 252, 260-1 through 260-3 and 270, similar to components 210, 220, 230, 240, 244a-c, 245, 250, 252, 260-1 through 260-3 and 270 described above with reference to FIG. 2. In contrast to device 200, instead of bonding layer 235 of device 200 of FIG. 2, device 300 includes bonding layer 310 disposed between second plate 220 and third plate 240. In some embodiments, bonding layer 310 includes a conductive material (e.g., is a metal bond). For example, bonding layer 310 can include a metal material. The conductive material can be selected to have a CTE that is about equal to the CTE of the second dielectric material and the third dielectric material. In some embodiments, the conductive material includes aluminum (Al). For example, bonding layer 310 can be an aluminum bond, an AlSi alloy bond, or other suitable metal bond. Bonding layer 310 may have an RF connection 320 using a via 322, which may be a hole drilled in third plate 240 that is filled with an electrically conductive material (e.g., a metal). Via 322 may be an RF component that can enable transmission of an RF signal to the metal bond 310.

Figure 4:
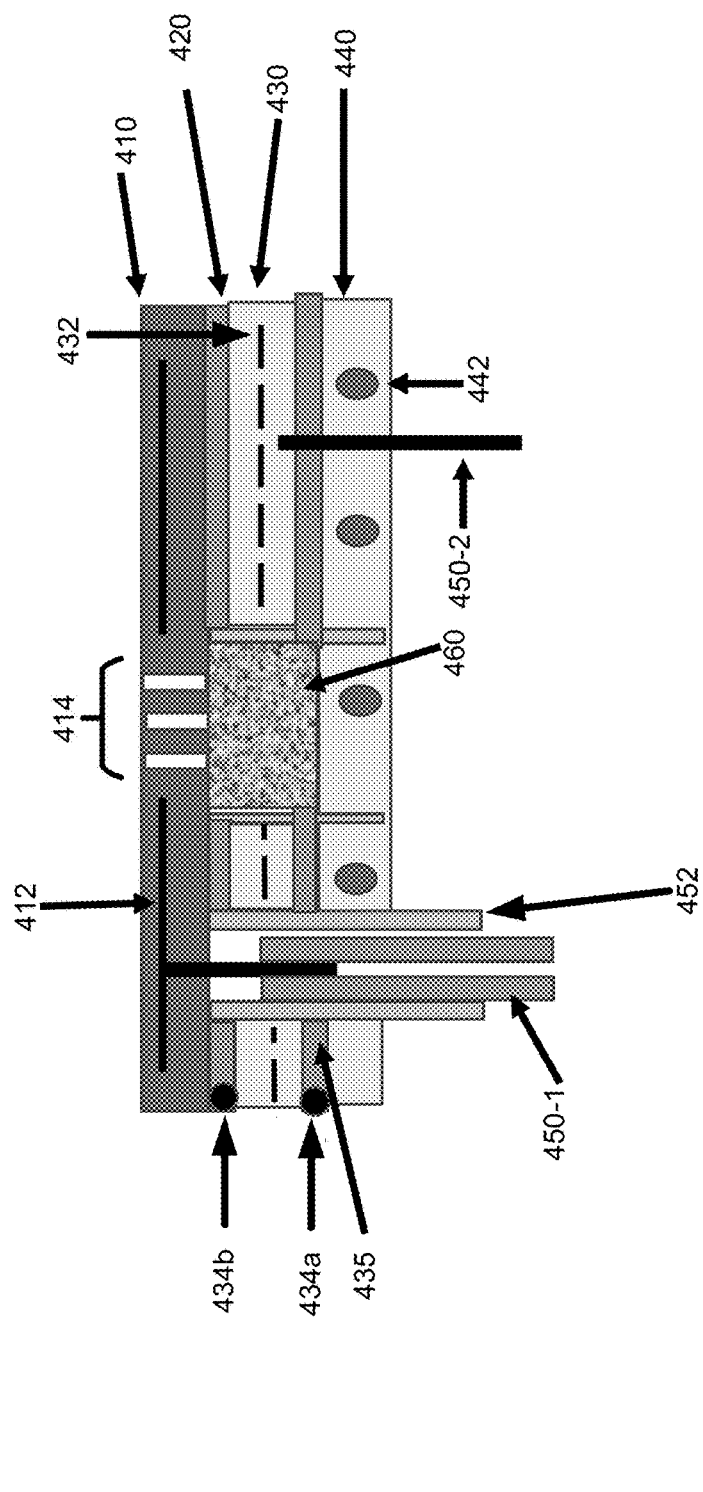
Figure 5:
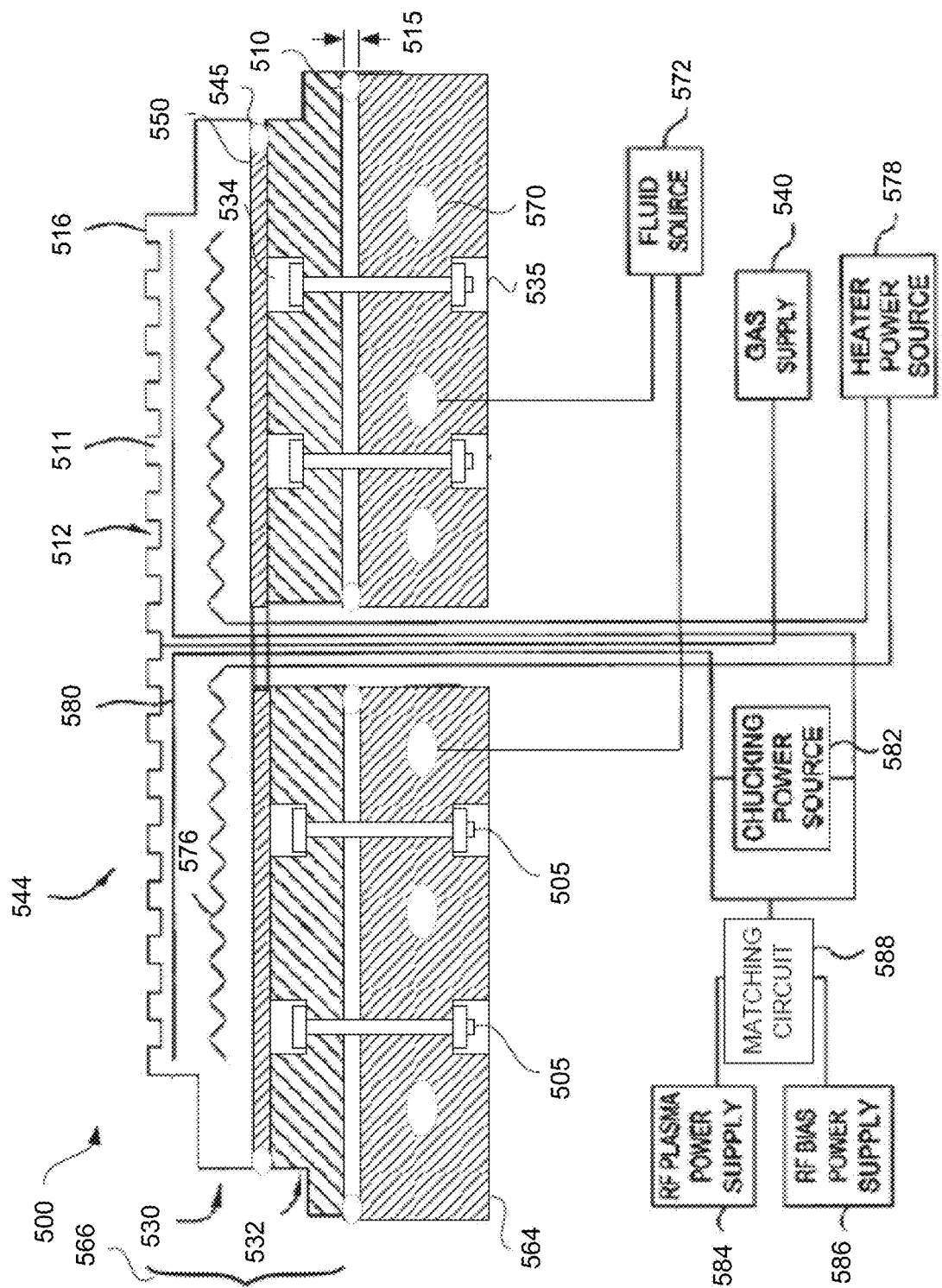
FIG. 5 is a sectional side view of a substrate support assembly, in accordance with some embodiments.

FIG. 4 is a cross-sectional view of substrate support device ("device") 400, in accordance with some embodiments. Device 400 can be a part of a substrate support assembly for use within a processing chamber to process a substrate (e.g., deposition, etching and/or lithography). In some embodiments, device 400 is an ESC. In some embodiments, device 400 is a heater. In some embodiments, device 400 is a multi-zone ESC for temperature control. In some embodiments, device 400 includes multiple temperature zones ("zones"). For example, device 400 can include at least four zones. In some embodiments, device 400 includes multiple sub-zones included within each zone. In some embodiments, the multiple sub-zones include at least fifty sub-zones. In some embodiments, the multiple sub-zones include at least 150 sub-zones.

As shown, device 400 includes first plate 410 having set of electrodes 412 embedded therein. Additionally, set of gas distribution channels 414 can be formed within first plate 410. For example, set of gas distribution channels 414 can be formed by drilling through first plate 210 (e.g., laser drilling). In some embodiments, first plate 410 is an ESC plate and set of electrodes 412 includes a set of chucking electrodes to enable a substrate to be securely held to first plate 410 during substrate processing. In some embodiments, set of electrodes 412 includes AEC electrodes to improve performance and to prevent arcing and damage during substrate processing. For example, if the voltage applied to the chucking electrodes becomes too large, the AEC electrodes can dissipate excess voltage and prevent arcing and damage to the substrate. In some embodiments, first plate 410 has a circular shape as viewed from the top of first plate 410 to secure a circular substrate. In some embodiments, first plate 410 has a rectangular shape as viewed from the top of first plate 410 to secure a rectangular substrate. First plate 410 is formed from a first dielectric material. In some embodiments, the first dielectric material is a ceramic material. For example, the first dielectric material can include AlN. As another example, the first dielectric material can include $Al_2O_3$. In some embodiments, first plate 410 has a thickness that ranges between about 0.5 mm to about 10 mm. In some embodiments, first plate 410 has a thickness that ranges between about 1 mm to about 5 mm.

As further shown, bonding layer 420 is disposed between first plate 410 and second plate 430. Second plate 430 is formed from the first dielectric material or a second dielectric material. In some embodiments, the second dielectric material is a ceramic material. For example, the second dielectric material can include AlN. As another example, the second dielectric material can include $Al_2O_3$. In some embodiments, second plate 430 has a thickness that ranges between about 0.5 mm to about 10 mm. In some embodiments, second plate 430 has a thickness that ranges between about 2 mm to about 6 mm.

In some embodiments, bonding layer 420 includes an inorganic dielectric material. The inorganic dielectric material can be selected to have a CTE that is about equal to the CTE of the first dielectric material and the second dielectric material. In some embodiments, the inorganic dielectric material includes a glass material. For example, the glass material can include at least one of: Si, Ba, Ca, Y, Mg, O, B, etc. In some embodiments, the first inorganic dielectric material includes another ceramic material including at least one of Al, Ca, Si, O, N, Y, Mg, F, B, etc. In some embodiments, the inorganic dielectric material comprises one or more constituents that are different from the first and/or second material of the first and/or second plates 410, 430.

Second plate 430 can be a heater plate to enable heating of a substrate secured to device 400. In some embodiments, second plate 430 is a heater plate including set of heater electrodes 432 embedded therein. For example, second plate 430 can be a primary heater plate to enable primary heating across multiple zones of device 400 (e.g., coarse temperature control). In some embodiments, device 400 includes four zones. As another example, second plate 430 can be a secondary heater plate to enable secondary heating across multiple sub-zones of device 400 (e.g., fine temperature control). In some embodiments, the multiple sub-zones include at least fifty sub-zones. In some embodiments, the multiple sub-zones include at least 150 sub-zones.

As further shown, bonding layer 435 is disposed between second plate 430 and third plate 440, where third plate 440 is a cooling plate that may not be a part of the substrate support 400. Third plate 440 can be a cooling plate having multiple cooling channels including cooling channel 442 embedded therein. Cooling channels including cooling channel 442 are pathways that allow a cooling fluid (e.g., water) to flow through device 400 to dissipate heat during substrate (e.g., wafer) processing without interfering with the ability of device 400 to hold the wafer securely in place. Third plate 440 may keep the temperature of device 400 and the substrate supported by device 400 within a safe range to prevent damage to device 400, the substrate and/or the rest of the processing chamber. The design and configuration of the cooling channels can depend on different variables, such as the structure of device 400 and/or the manufacturing processes being used to process the substrate. In some embodiments, third plate 440 is formed from the first dielectric material, the second dielectric material, or a third dielectric material. In some embodiments, the third dielectric material is a ceramic material. For example, the third dielectric material can include AlN. As another example, the third dielectric material can include $Al_2O_3$. In some embodiments, third plate 440 is formed from aluminum or another metal having a high thermal conductivity. In some embodiments, third plate 440 has a thickness that ranges between about 0.5 mm to about 10 mm. In some embodiments, fourth plate 250 has a thickness that ranges between about 2 mm to about 6 mm.

In some embodiments, bonding layer 435 includes an organic material (i.e., organic bond). Examples of organic materials include epoxy resins, acrylic adhesives, cyanoacrylate adhesive, phenolic resins, etc. In some embodiments, bonding layer 435 includes a conductive material (e.g., metal material). For example, bonding layer 435 can be an aluminum bond, an AlSi alloy bond, or other suitable metal bond. In some embodiments, bonding layer 435 includes an inorganic material (i.e., inorganic bond). In some embodiments, bonding layer 435 includes a dielectric material (e.g., organic or inorganic dielectric bond). The third inorganic dielectric material can be selected to have a CTE that is about equal to the CTE of the third dielectric material and the fourth dielectric material. In some embodiments, instead of using bonding layer 435, second plate 430 is secured to third plate 440 via another securing mechanism. The securing mechanism can include a set of fasteners. For example, second plate 430 can be bolted to fourth plate 440.

In some embodiments, at least one sealing structure can be disposed between at least one pair of plates to provide insulation, sealing and/or isolation, such as sealing structure 434a disposed between second plate 430 and fourth plate 440. In some embodiments, a sealing structure is a washer. In some embodiments, a sealing structure is an O-ring or gasket. In this illustrative example, sealing structure 434b is shown disposed between first plate 410 and second plate 430. In some embodiments, a sealing structure is not disposed between first plate 410 and second plate 430.

Device 400 can include various contacts to enable electrical connection to respective sets of electrodes of device 400. As shown, the contacts can include contacts 450-1 and 450-2 coupled to respective sets of electrodes 412 and 432. For example, contact 450-1 can be a chucking contact which can be used to apply a voltage to set of electrodes 212 that can generate an electrostatic force to secure a substrate to first plate 410. Contact 450-1 may be a high voltage contact, and may be disposed within insulating sleeve 452 (e.g., a ceramic tube) that may isolate the high voltage contact from an external environment. As another example, contact 450-2 can be a first heater contact which can be used to apply a voltage to first set of heater electrodes 432 to control heating for device 400.

Device 400 can further include plug 460 disposed in a region formed within the second and/or third plates 230, 240. Once device 400 is installed on third plate 440, plug 460 may be encapsulated between first plate 410 and third plate 440. Plug 460 can be used to reduce plasma formation and/or arcing to prevent damage to device 400 and/or the substrate. In some embodiments, plug 460 is a porous plug. Plug 460 can include any suitable material. For example, plug 460 can include a porous dielectric material. Examples of porous dielectric materials include porous ceramic materials such as porous AlN or $Al_2O_3$. The porosity of plug 460 can be selected to inhibit plasma formation and/or arcing, while allowing heat transfer fluid to flow through the ceramic plug and reach the substrate support surface through set of gas distribution channels 414. In some embodiments, the porosity of plug 460 ranges between about 30% to about 60%. Plug 460 can be bonded to first plate 410 and third plate 440 using any suitable bonding. For example, plug 460 can be bonded to at least one of first plate 410, second plate 420 and/or third plate 430 using a high-temperature adhesive (e.g., a high-temperature glue).

In some embodiments, a set of fasteners and/or threaded inserts are embedded within at least one plate (not shown). For example, sets of fasteners can be embedded within at least plate 420 and/or plate 430. In some embodiments, a set of fasteners (e.g., threaded fasteners) and/or threaded inserts are embedded in features in plate 420, and plate 430 includes holes that provide access to the threaded inserts or that enable threaded shafts of threaded fasteners to protrude from the bottom of device 400 (e.g., so that device 400 can be fastened to third plate 440). Each set of fasteners and/or threaded inserts can include fasteners formed from a material that has a suitably low CTE and/or a suitably high thermal conductivity. In some embodiments, each set of fasteners and/or threaded inserts is a set of molybdenum (Mo) fasteners and/or threaded inserts. One example of the use of threaded inserts and fasteners is shown in FIG. 5. Further details regarding fabricating device 400 will be described below with reference to FIG. 6.

FIG. 5 is a sectional side view of one embodiment of substrate support assembly 500, in accordance with some embodiments. Substrate support assembly 500 includes a puck 566 made up of upper puck plate 530, and lower puck plate 532 that are bonded together by bond 550. Upper puck plate 530 and lower puck plate 532 can each include a dielectric material (e.g., ceramic material). Lower puck plate 532 and upper puck plate 532 may be made of the same materials. In some embodiments, lower puck plate 532 is made of materials which are different from the materials used for upper puck plate 530. In some embodiments, lower puck plate 532 is composed of a metal matrix composite material. In some embodiments, the metal matrix composite material includes aluminum and silicon. In some embodiments, the metal matrix composite is a SiC porous body infiltrated with an AlSi alloy. In some embodiments, upper puck plate 530 and lower puck plate 532 include an aluminum material (e.g., AlN or $Al_2O_3$).

O-ring 545 may be made of a plasma resistant material. For example, O-ring 545 can include perfluoropolymer (PFP). O-ring 545 may can include PFP with inorganic additives such as SiC. O-ring 545 may be replaceable. When O-ring 545 degrades it may be removed and a new O-ring may be stretched over upper puck plate 530 and placed at a perimeter of puck 566 at an interface between upper puck plate 530 and lower puck plate 532. O-ring 545 may protect bond 550 from erosion by plasma.

Upper puck plate 530 includes mesas 511, channels 512 and an outer ring 516. Upper puck plate 530 includes clamping electrodes 580 and one or more heating elements 576. Clamping electrodes 580 are coupled to chucking power source 582, and to RF plasma power supply 584 and RF bias power supply 586 via matching circuit 588. Upper puck plate 530 and lower puck plate 532 may additionally include gas delivery holes (not shown) through which a gas supply 540 pumps a backside gas, such as helium (He).

Upper puck plate 530 may have a thickness of about 3-25 mm. In some embodiments, upper puck plate 530 has a thickness of about 3 mm. Clamping electrodes 580 may be located about 1 mm from an upper surface of upper puck plate 530, and heating elements 576 may be located about 1 mm under the clamping electrodes 580. Heating elements 576 may be screen printed heating elements having a thickness of about 10-200 microns. Alternatively, in some embodiments, heating elements 576 may be resistive coils that use about 1-3 mm of thickness of upper puck plate 530. In such embodiments, upper puck plate 530 may have a minimum thickness of about 5 mm. In some embodiments, lower puck plate 532 has a thickness of about 8-25 mm.

Heating elements 576 are electrically connected to heater power source 578 for heating upper puck plate 530. Lower puck plate 532 is coupled to and in thermal communication with cooling plate 564 having one or more cooling channels 570 (e.g., conduits) in fluid communication with fluid source 572. In some embodiments, cooling plate 564 is coupled to puck 566 by multiple fasteners 505. Fasteners 505 may be threaded fasteners such as nut and bolt pairs. As shown, lower puck plate 532 includes multiple features 534 for accommodating fasteners 505. Cooling plate 564 likewise includes multiple features 535 for accommodating fasteners 505. In some embodiments, features are bolt holes with counter bores. As shown, the features 534 are through features that extend through lower puck plate 532. Alternatively, the features 534 may not be through features. In some embodiments, 534 are slots that accommodate a T-shaped bolt head or rectangular nut that may be inserted into the slot and then rotated 90 degrees. In one embodiment, fasteners include washers, flexible graphite, aluminum foil, or other load spreading materials to distribute forces from a head of the fastener evenly over a feature.

In one embodiment (as shown), O-ring 510 is vulcanized to (or otherwise disposed on) at a perimeter of cooling plate 564. Alternatively, O-ring 510 may be vulcanized to the bottom side of the lower puck plate 532. Fasteners 505 may be tightened to compress O-ring 510. Fasteners 505 may each be tightened with approximately the same force to cause separation 515 between puck 566 and cooling plate 564 to be approximately the same (uniform) throughout the interface between puck 566 and cooling plate 564. This may ensure that the heat transfer properties between cooling plate 564 and puck 566 are uniform. In one embodiment, separation 515 is about 2-10 mils. Separation 515 may be 2-10 mils, for example, if O-ring 510 is used without a flexible graphite layer. If a flexible graphite layer is used along with O-ring 510, then the separation may be about 10-40 mils. Larger separations may decrease heat transfer, and can cause the interface between puck 566 and the cooling plate 564 to act as a thermal choke. In some embodiments, a conductive gas may be flowed into separation 515 to improve heat transfer between puck 566 and the cooling plate 564.

Separation 515 minimizes the contact area between puck 566 and cooling plate 564. Additionally, by maintaining a thermal choke between puck 566 and cooling plate 564, puck 566 may be maintained at much greater temperatures than cooling plate 564. For example, in some embodiments puck 566 may be heated to temperatures of 180-300 degrees Celsius, while cooling plate 564 may maintain a temperature of below about 120 degrees Celsius. Puck 566 and cooling plate 564 are free to expand or contract independently during thermal cycling.

Separation 515 may function as a thermal choke by restricting the heat conduction path from puck 566 (e.g., heated puck) to cooling plate 564 (e.g., cooled cooling plate). In a vacuum environment, heat transfer may be primarily a radiative process unless a conduction medium is provided. Since puck 566 may be disposed in a vacuum environment during substrate processing, heat generated by heating elements 576 may be transferred more inefficiently across the separation 515. Therefore, by adjusting separation 515 and/or other factors that affect heat transfer, the heat flux flowing from puck 566 to cooling plate 564 may be controlled. To provide efficient heating of the substrate, it is desirable to limit the amount of heat conducted away from upper puck plate 530.

In some embodiments (not shown), a flexible graphite layer is disposed between puck 566 and cooling plate 564 within a perimeter of O-ring 510. The flexible graphite layer may have a thickness of about 10-40 mil. Fasteners 505 may be tightened to compress the flexible graphite layer as well as O-ring 510. The flexible graphite layer may be thermally conductive, and may improve a heat transfer between puck 566 and cooling plate 564.

In some embodiments (not shown), cooling plate 564 includes a base portion to which the O-ring 510 may be vulcanized. Cooling plate 564 may additionally include a spring loaded inner heat sink connected to the base portion by one or more springs. The springs can apply a force to press the inner heat sink against puck 566. A surface of the heat sink may have a predetermined roughness and/or surface features (e.g., mesas) that control heat transfer properties between puck 566 and the heat sink. Additionally, the material of the heat sink may affect the heat transfer properties. For example, an aluminum heat sink will transfer heat better than a stainless steel heat sink. In one embodiment, the heat sink includes a flexible graphite layer on an upper surface of the heat sink.

Figure 6:
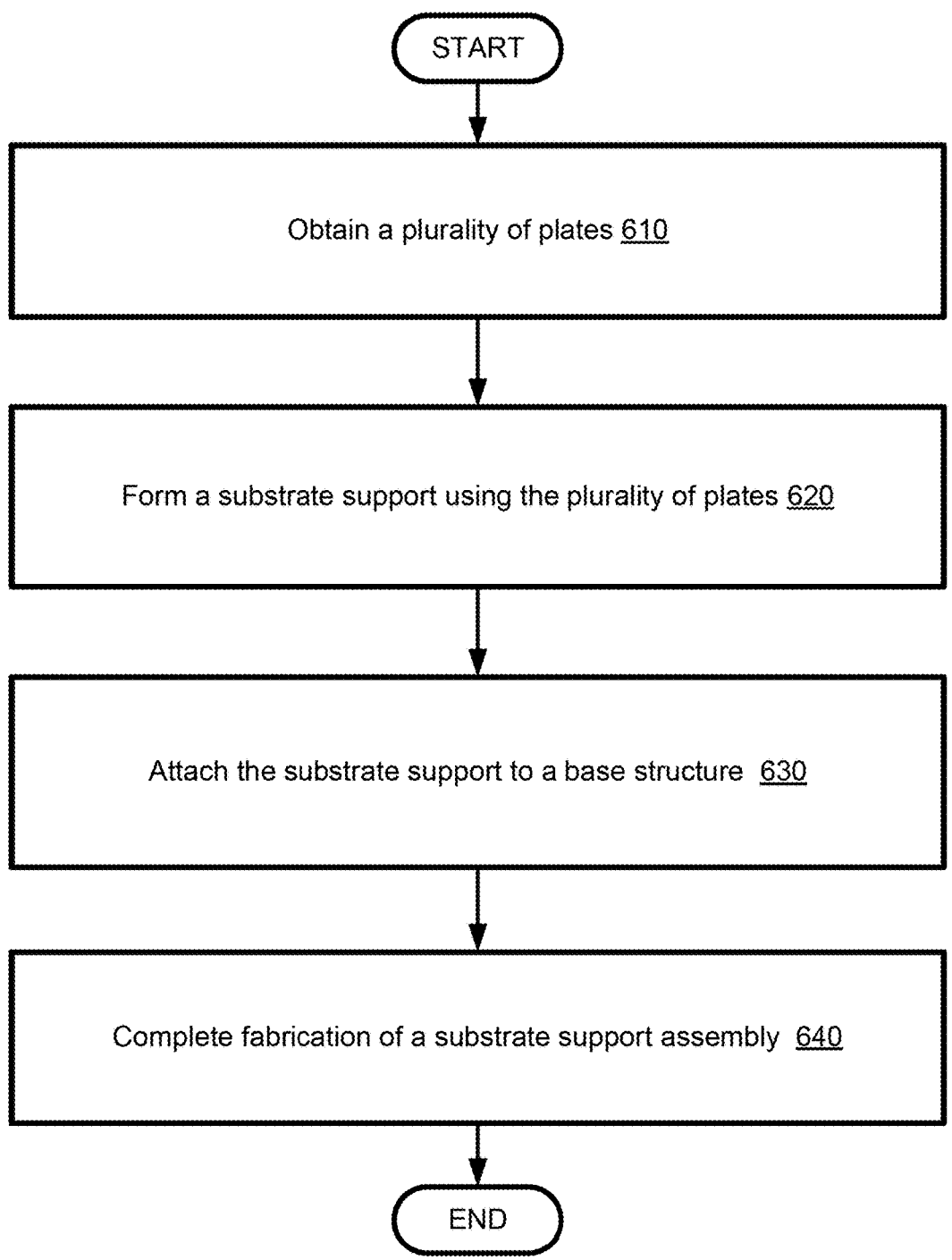
FIGS. 6-7 are flowcharts of example methods for fabricating substrate support assemblies using inorganic dielectric bonding, in accordance with some embodiments.

FIG. 6 is a flow chart of an example method 600 for fabricating substrate support assemblies using inorganic dielectric bonding. For example, method 600 can be performed to fabricate a device that can be included within a substrate support assembly of a processing chamber to process a substrate. In some embodiments, method 600 can be used to form device 200 of FIG. 2 or device 300 of FIG. 3.

At block 610, a plurality of plates is obtained and, at block 620, a substrate support is formed using the plurality of plates. The plurality of plates can include including at least a first plate and a second plate. Obtaining the plurality of plates can include manufacturing at least one plate of the plurality of plates. The substrate support can be a component of a substrate support assembly of a process chamber to support a substrate during processing. In some embodiments, the substrate support is an ESC. In some embodiments, the substrate support is a heater. Each plate of the plurality of plates can be formed from a dielectric material. In some embodiments, each plate of the plurality of plates is formed from a ceramic material. For example, each plate of the plurality of plates can be formed from at least one of include AlN, $Al_2O_3$, etc.

The first plate can receive the substrate. The first plate can include a first set of electrodes embedded therein and the second plate can include a second set of electrodes embedded therein. In some embodiments, obtaining the first plate includes embedding the first set of electrodes within the first plate. In some embodiments, obtaining the second plate includes embedded the second set of electrodes within the second plate. In some embodiments, the first plate has a circular shape as viewed from the top of first plate to receive a circular substrate. In some embodiments, the first plate has a rectangular shape as viewed from the top of first plate to receive a rectangular substrate. The first plate can receive the substrate and securely hold the substrate during processing. In some embodiments, the first plate can have a thickness that ranges between about 0.5 mm to about 10 mm. In some embodiments, first plate has a thickness that ranges between about 1 mm to about 5 mm. In some embodiments, the second plate has a thickness that ranges between about 0.5 mm to about 10 mm. In some embodiments, the second plate has a thickness that ranges between about 2 mm to about 6 mm.

In some embodiments, the first plate is an ESC plate. For example, the first set of electrodes can include a set of chucking electrodes to securely hold the substrate using an electrostatic force generated by the first set of electrodes. In some embodiments, the first set of electrodes further includes an AEC electrode. In some embodiments, the second plate is a heater plate. For example, the second set of electrodes can include a set of heating electrodes to control temperature during substrate processing. In some embodiments, the second plate is a primary heater plate including a set of primary heating electrodes to enable primary heating across multiple zones of the device (e.g., coarse temperature control). In some embodiments, the device includes four zones. In some embodiments, the second plate is a secondary heater plate including a set of secondary heating electrodes to enable secondary heating across multiple sub-zones of the device (e.g., fine temperature control). In some embodiments, the multiple sub-zones include at least fifty sub-zones. In some embodiments, the multiple sub-zones include at least 150 sub-zones.

In some embodiments, the first plate is a first heater plate and the second plate is a second heater plate. For example, the first set of electrodes can include a first set of heating electrodes to control temperature during substrate processing and the second set of electrodes can include a second set of heating electrodes to control temperature during substrate processing. For example, one of the first plate or the second plate can be a primary heater plate and the other of the first plate or the second plate can be a secondary heater plate.

In some embodiments, the plurality of plates further includes a third plate. The third plate can be formed from a third dielectric material. In some embodiments, the third dielectric material is a ceramic material. In some embodiments, the third plate has a thickness that ranges between about 0.5 mm to about 10 mm. In some embodiments, the third plate has a thickness that ranges between about 2 mm to about 6 mm. In some embodiments, the first plate is an ESC plate, the second plate is a first heater plate and the third plate is a second heater plate. For example, one of the second plate or the third plate can be a primary heater plate and the other of the second plate or the third plate can be a secondary heater plate.

At block 630, the substrate support is attached to a base structure. In some embodiments, the substrate support is attached to a cooling plate of the base structure, with the cooling plate having a set of cooling channels embedded therein. In some embodiments, attaching the substrate support to the base structure includes bonding the second plate or the third plate to the base structure. For example, the second plate or the third plate can be bonded to the base structure using an organic bond including an organic material. As another example, the second plate or the third plate can be bonded to the base structure using a conductive bond including a conductive material (e.g., metal material). As yet another example, the second plate or the third plate can be bonded to the base structure using an inorganic bond including an inorganic material. In some embodiments, the bond between the second plate or the third plate and the base structure includes a dielectric material (e.g., organic or inorganic dielectric bond). The material of the bond between the second plate and the third plate can be selected to have a CTE that is about equal to the CTE of the material of the second plate and the material of the base structure. In some embodiments, bonding the second plate or the third plate to the base structure further includes forming a sealing structure between the second plate or the third plate and the base structure to provide insulation (e.g. washer or O-ring).

At block 640, fabrication of a substrate support assembly is completed. Completing fabrication of the substrate support assembly can further include forming a set of contacts, where each contact of the set of contacts is formed to a respective set of electrodes. For example, the set of contacts can include a chucking contact and a heater contact. In some embodiments, the second set of electrodes includes a set of primary heating electrodes, and the heater contact is a primary heater contact coupled to the set of primary heating electrodes. In some embodiments, the second set of electrodes includes a set of secondary heating electrodes, and the heater contact is a secondary heater contact coupled to the set of secondary heating electrodes.

Figure 7:
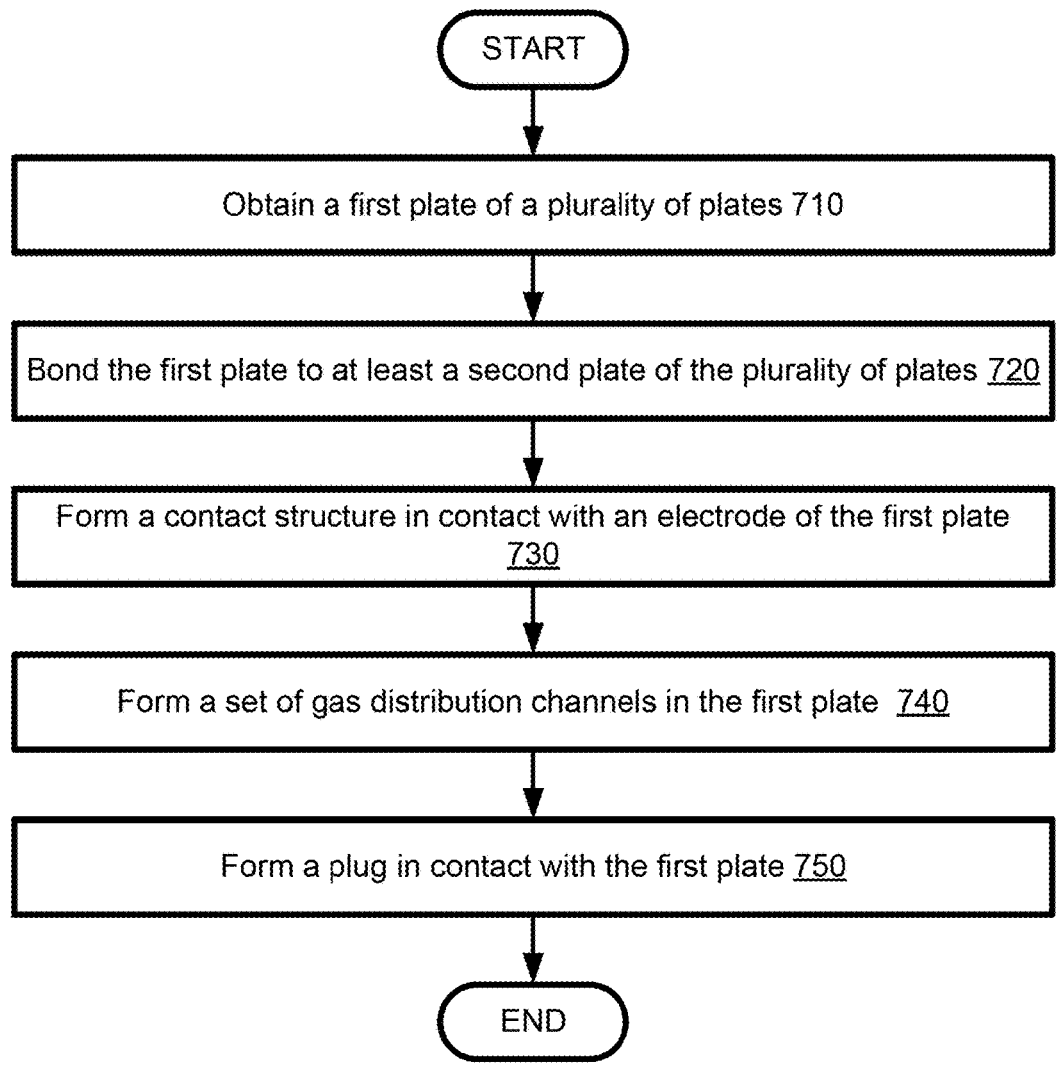

FIG. 7 is a flow chart of an example method 620 for forming a substrate support using the plurality of plates. For example, method 620 can be performed to fabricate a device that can be included within a substrate support assembly of a processing chamber to process a substrate. In some embodiments, method 620 can be used to form device 200 of FIG. 2 or device 300 of FIG. 3.

At block 710, a first plate of a plurality of plates is obtained and, at block 720, the first plate is bonded to at least a second plate of the plurality of plates. For example, the first plate can be similar to the first plate described above with reference to FIG. 6 and the second plate can be similar to the second plate described above with reference to FIG. 6. In some embodiments, obtaining the first plate includes forming the first plate. For example, forming the first plate can include embedded the first set of electrodes within the first plate, as described above with reference to FIG. 6.

More specifically, bonding the first plate to the second plate can include bonding the first plate to the second plate by forming a first inorganic dielectric bond including an inorganic dielectric material. The inorganic dielectric material can be selected to have a CTE that is about equal to the CTE of the first dielectric material and the second dielectric material. In some embodiments, the inorganic dielectric material includes a glass material. For example, the glass material can include at least one of: Si, Ba, Ca, Y, Mg, O, B, etc. In some embodiments, the inorganic dielectric material includes another ceramic material including at least one of Al, Ca, Si, O, N, Y, Mg, F, B, etc. In some embodiments, bonding the first plate to the second plate further includes forming a sealing structure between the first plate and the second plate to provide insulation. For example, the sealing structure can be a washer. As another example, the sealing structure can include an O-ring or gasket.

In some embodiments, bonding at least the first plate to the second plate further incudes bonding the second plate to a third plate of the plurality of plates. For example, bonding the first plate to the second plate can include bonding the second plate to the third plate by forming a second inorganic dielectric bond including an inorganic dielectric material (which can be the same or different from the first inorganic dielectric bond). As another example, the second plate can be bonded to the third plate using a conductive bond (e.g., metal bond). In some embodiments, bonding the second plate to the third plate further includes forming a sealing structure between the second plate and the third plate to provide insulation (e.g. washer or O-ring). As yet another example, the second plate can be bonded to the third plate using an organic bond. In some embodiments, the first plate is bonded to the second plate and the second plate is bonded to the third plate simultaneously. In some embodiments, the first plate is bonded to the second plate and the second plate is bonded to the third plate consecutively.

At block 730, a contact structure is formed in contact with an electrode of the first plate. More specifically, the contact structure can be formed to be in contact with an electrode of the first plate. In some embodiments, the contact structure includes a high-voltage (HV) contact. In some embodiments, forming the contact structure includes forming a hole to expose the first plate, and forming the contact structure within the hole. For example, forming the hole can include drilling the hole within at least the second plate. In some embodiments, forming the contact structure includes brazing the contact structure.

At block 740, a set of gas distribution channels is formed in the first plate. For example, forming the set of gas distribution channels in the first plate can include drilling through the first plate (e.g., laser drilling). In some embodiments, the set of gas distribution channels can be formed during step 710 (e.g., prior to bonding the first plate to the second plate).

At block 750, a porous plug is formed in contact with the first plate. Forming the porous plug in contact with the first plate can include forming a cavity exposing the first plate, and securing the porous plug within the cavity. More specifically, the cavity can expose the set of gas distribution channels. In some embodiments, the porous plug is bonded to the surface of the first plate and on the set of gas distribution channels, and sidewalls of the cavity. The porous plug can be used to reduce plasma formation and/or arcing to prevent damage to the device and/or the substrate. The porosity of plug can be selected to inhibit plasma formation, while allowing heat transfer fluid to reach the substrate support surface. The porous plug can include any suitable material. For example, the porous plug can include a porous dielectric material. The plug can be bonded using any suitable bonding. For example, the plug can be bonded using a high-temperature adhesive (e.g., high-temperature glue).

After forming the porous plug, the substrate support can be attached to a base structure (e.g., a cooling plate). For example, the base structure can be provided with a hole with an approximately same thickness as the hole through which the contact structure was formed to be in contact with the electrode of the first plate. In some embodiments, forming the contact structure includes forming the hole through the base structure and at least the second plate. Further details regarding blocks 710-750 are described above with reference to FIGS. 1-6.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within +25%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A substrate support assembly, comprising:
 a substrate support comprising:
  a first plate comprising a first dielectric material and having a first set of electrodes embedded therein;
  a second plate comprising the first dielectric material or a second dielectric material and having a second set of electrodes embedded therein; and
  an inorganic dielectric bond comprising an inorganic dielectric material disposed between the first plate and the second plate.

2. The substrate support assembly of claim 1, wherein at least one of the first dielectric material or the second dielectric material is a ceramic material.

3. The substrate support assembly of claim 1, wherein the first plate is an electrostatic chuck (ESC) plate and the first set of electrodes comprises a set of chucking electrodes, and wherein the second plate is a heater plate comprising a set of heating electrodes.

4. The substrate support assembly of claim 3, the substrate support further comprising:

a third plate comprising a second set of heating electrodes; and a bond disposed between the second plate and the third plate.

5. The substrate support assembly of claim 4, wherein the bond is a second inorganic dielectric bond comprising a second inorganic dielectric material.

6. The substrate support assembly of claim 1, wherein the first plate is a first heater plate and the first set of electrodes comprises a first set of heater electrodes, and wherein the second plate is a second heater plate and the second set of electrodes comprises a second set of heater electrodes.

7. The substrate support assembly of claim 6, wherein:
the first plate is a first one of:
a primary heater plate comprising a set of primary heating electrodes to enable primary heating across multiple zones; or
a secondary heater plate comprising a set of secondary heating electrodes to enable secondary heating across multiple sub-zones; and
the second plate is a second one of: the secondary heater plate or the primary heater plate.

8. The substrate support assembly of claim 1, wherein the inorganic dielectric material is different from the first dielectric material and the second dielectric material.

9. The substrate support assembly of claim 1, wherein the inorganic dielectric material comprises a ceramic or glass comprising at least one of: Al, Si, Ba, Ca, Y, Mg, F, N, O or B.

10. The substrate support assembly of claim 1, further comprising a cooling plate coupled to the substrate support, the cooling plate comprising a set of cooling channels.

11. The substrate support assembly of claim 1, further comprising a shaft coupled to the substrate support.

12. A processing chamber comprising:
a substrate support assembly comprising a substrate support coupled to a cooling plate comprising a set of cooling channels, the substrate support comprising:
a first plate comprising a first dielectric material and having a first set of electrodes embedded therein;
a second plate comprising the first dielectric material or a second dielectric material and having a second set of electrodes embedded therein; and
an inorganic dielectric bond comprising an inorganic dielectric material disposed between the first plate and the second plate.

13. The processing chamber of claim 12, wherein the first plate is an electrostatic chuck (ESC) plate and the first set of electrodes comprises a set of chucking electrodes, and wherein the second plate a heater plate.

14. The processing chamber of claim 13, wherein the substrate support further comprises:
a third plate comprising a second set of heating electrodes; and
a second inorganic dielectric bond comprising a second inorganic dielectric material disposed between the second plate and the third plate.

15. The processing chamber of claim 12, wherein the first plate is a first heater plate and the first set of electrodes comprises a first set of heater electrodes, and wherein the second plate is a second heater plate and the second set of electrodes comprises a second set of heater electrodes.

16. The processing chamber of claim 14, wherein:
the first plate is a first one of:
a primary heater plate comprising a set of primary heating electrodes to enable primary heating across multiple zones; or
a secondary heater plate comprising a set of secondary heating electrodes to enable secondary heating across multiple sub-zones; and
the second plate is a second one of: the secondary heater plate or the primary heater plate.

17. The processing chamber of claim 12, wherein the inorganic dielectric material comprises a ceramic or glass comprising at least one of: Al, Si, Ba, Ca, Y, Mg, F, N, O or B.

18. The processing chamber of claim 12, wherein the substrate support assembly further comprises a cooling plate coupled to the substrate support, the cooling plate comprising a set of cooling channels.

19. The processing chamber of claim 12, further comprising a shaft coupled to the substrate support.

20. A method comprising:
forming a substrate support of a substrate support assembly, wherein forming the substrate support comprises bonding a first plate to a second plate using an inorganic dielectric bond comprising an inorganic dielectric material disposed between the first plate and the second plate, wherein the first plate comprises a first dielectric material having a first set of electrodes embedded therein, and wherein the second plate comprises the first dielectric material or a second dielectric material and having a second set of electrodes embedded therein; and
attaching the substrate support to a base structure comprising a cooling plate having a set of cooling channels.

\* \* \* \* \*